(12) United States Patent
McNamara

(10) Patent No.: US 6,862,437 B1
(45) Date of Patent: Mar. 1, 2005

(54) DUAL BAND TUNING

(75) Inventor: Brian Joseph McNamara, Haverill, MA (US)

(73) Assignee: Tyco Electronics Corporation, Wilmington, DE (US)

( * ) Notice: Subject to any disclaimer, the term of this patent is extended or adjusted under 35 U.S.C. 154(b) by 0 days.

(21) Appl. No.: 09/450,912

(22) Filed: Nov. 29, 1999

Related U.S. Application Data

(63) Continuation-in-part of application No. 09/325,478, filed on Jun. 3, 1999.

(51) Int. Cl.[7] ................................................. H04B 1/18
(52) U.S. Cl. ............................... 455/188.1; 455/192.3; 455/182.3; 331/177 R; 331/179
(58) Field of Search ........................... 455/188.1, 192.3, 455/182.3, 73, 77, 84, 91, 114, 118, 120, 123, 124, 125, 191.3, 180.1, 108.2, 188.2, 191.2; 331/177 R, 179, 181, 177 V, 36 C, 36 L, 34

(56) References Cited

U.S. PATENT DOCUMENTS

| | | | | |
|---|---|---|---|---|
| 3,624,514 A | * | 11/1971 | Putzer | 455/180.4 |
| 4,023,106 A | * | 5/1977 | Utsunomiya | 455/179.1 |
| 4,326,295 A | * | 4/1982 | Matsumoto et al. | 455/188 |
| 4,905,306 A | * | 2/1990 | Anderson | 455/191.3 |
| 5,808,879 A | * | 9/1998 | Liu et al. | 363/17 |
| 5,995,814 A | * | 11/1999 | Yeh | 455/180.1 |
| 6,134,452 A | * | 10/2000 | Hufford et al. | 455/552.1 |
| 6,311,050 B1 | * | 10/2001 | Welland et al. | 455/260 |

* cited by examiner

Primary Examiner—David Hudspeth
Assistant Examiner—S. Smith

(57) ABSTRACT

A dual band RF tuning circuit (1) has a first impedance element (4) and a second impedance element (5) between an RF input port (2) and an RF output port (3), tuning being provided by the impedance elements (4, 5) to a first RF signal, and a switching transistor (9) connected to the second impedance element (5) to open circuit the second impedance element (5) for tuning to a second RF signal by the first impedance element (4) alone.

21 Claims, 4 Drawing Sheets

DUAL BAND TUNING

CROSS REFERENCE TO RELATED APPLICATION

This application is a continuation in part of application Ser. No. 09/325,478, filed Jun. 3, 1999.

FIELD OF THE INVENTION

The invention relates to a circuit that is switchable to different frequency bands, and to a circuit that is digitally switchable to different frequency bands by changes in reactive circuit elements of the circuit.

BACKGROUND OF THE INVENTION

Wireless telephones operate in more than one frequency band, for example, Cellular 900 MHz and PCS 1900 MHz. In the past, to operate in more than one frequency band, a separate, narrow band, RF circuit was provided for each of the different bands. The advantage was that each narrow band circuit could be tuned precisely for optimum performance within its tuned frequency band. A disadvantage resided in the relatively large collective sizes of the individual circuits, which restrained the ability to make wireless phones smaller. Further, since the addition of each frequency band required an additional tuned circuit, manufacturing costs were increased. Further, switching among the separate circuits required an external switch, a switch that was external to the RF tuned circuits. An external switch increases manufacturing cost, and operates slowly in an external circuit.

As described in U.S. Pat. No. 3,611,154, a known circuit that is switchable to different frequency bands, for example, UHF and VHF bands, has a local oscillator with a transistor that is biased by a bias voltage applied at a point designated "A" to an LC (inductance, capacitance) resonant circuit connected between the base and collector of the transistor. The resonant circuit is referenced to ground or earth. A varicap diode in the resonant circuit has its capacitance varied by the value of its bias voltage, which allows tuning of the resonant circuit of the local oscillator for resonance with a first frequency band, UHF, for example. To switch to a second frequency band, VHF, for example, a switching diode starts conducting. The switching diode is connected at the junction of two inductors in the LC resonant circuit, and is biased to a conducting state by a switching voltage applied at a point designated "S". There are DC blocking capacitors between earth and the switching diode, such that when a double throw switch is thrown to apply the switching voltage to the diode, the diode is biased to a conducting state, causing current to flow through one of the inductors to ground. Thereby, one of the two inductors becomes shorted to ground, which tunes the resonant circuit for resonance with the second frequency band.

Disadvantages of the known circuit reside in the double throw switch, which is external to the RF tuned circuit. The RF tuned circuit must be manufactured with the switch as an external component. Further, the switch is slow to operate as it is external to the RF tuned circuit. The known circuit is further disadvantageous as having an ECL biased transistor, which is not suitable for low voltage operation. The double throw switch of the known circuit in the off position is shunted to ground through a resistive load in parallel with a Zener diode, which dissipates current, and which is unsuitable for use in a low voltage device, such as, a dual frequency band, personal communications unit.

Another known circuit switchable to different frequency bands is described in U.S. Pat. No. 4,379,269. The known circuit has an FET transistor in which one gate is supplied by a bias voltage and a second gate is fed with a uniform voltage by an automatic gain control, AGC. A voltage that is used as the bias voltage is divided at a voltage dividing point. A switching voltage is used to switch to different frequency bands. The switching voltage is supplied to a switching diode. The switching diode conducts and shorts an inductor of a resonant circuit to ground. The switching diode feeds the switching voltage at the voltage dividing point, which raises the voltage at the dividing point upon the reception of a high frequency band. Upon selection of a low band a bias voltage is applied to the switching diode, which back biases the diode. The diode ceases to conduct, and the inductor of the resonant circuit is no longer shorted to ground. At the same time, the bias voltage is applied to a voltage dividing circuit and is impressed as the bias voltage upon the first gate of the FET, which tunes the RF circuit to a lower frequency band. The FET has its AGC delayed if the bias voltage to the first gate is lowered. The FET has its AGC advanced if the bias voltage at the first gate is made higher. A disadvantage of the known circuit is its unsuitability for a low voltage application, such as personal communication devices, because the switching diode is a discrete circuit element-requiring significant voltage for its bias, either forward or backward bias. Further, the switching diode is an active device having its own characteristics as a reactive element with capacitance and inductance values that deter the precise tuning of the resonant circuit to different frequency bands.

SUMMARY OF THE INVENTION

The invention relates to dual band matching by either a dual band inductance circuit or a dual band capacitance circuit. The invention allows many of the same circuit elements and functions to be used in different frequency bands without significant performance degradation or increase in size. The invention utilizes matching circuit networks capable of precise tuning to multiple frequency bands. According to an embodiment of the invention, MESFET switches are integral with the tuning circuits, which enables fast switching response and low voltage operation, as opposed to known circuits having external switching devices, such as, a double throw switch and a switching diode, as described by the above referenced patents. The MESFET switched circuits according to the invention are fabricated as part of the tuning circuit, and are of lower inherent impedances than discrete switching devices, which enables precise tuning to multiple frequency bands. The MESFET switched circuit is adaptable for dual band tuning of reactive element tuning circuits, including dual band inductance circuits and dual band capacitance circuits.

DESCRIPTION OF THE DRAWINGS

Embodiments of the invention will now be described by way of example with reference to the accompanying drawings, according to which.

DETAILED DESCRIPTION

Figure 1:
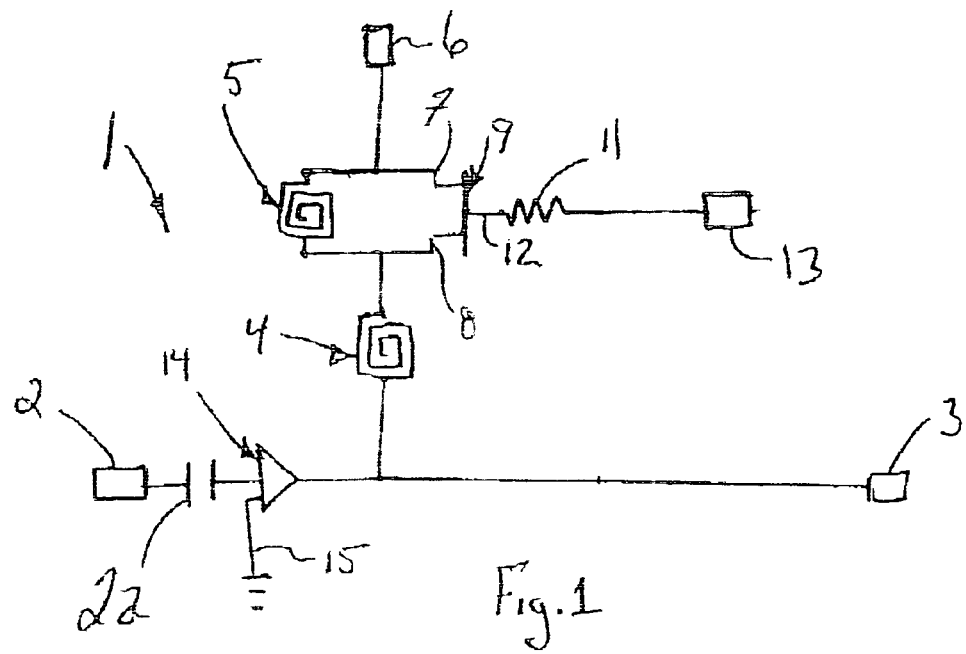
FIG. 1 is a schematic view of a dual band RF tuning circuit.

With reference to FIG. 1, a dual band RF tuning circuit 1 is in the form of a dual band inductance tuning circuit connected between an RF input port 2 and an RF output port 3. The input port 2 receives an input RF signal of a selected frequency band. The input port includes a DC blocking capacitor 2a. Tuning is provided by a first impedance element 4 in the form of an inductance impedance element having a first inductance $L_a$ and a second impedance element 5 in the form of a second inductance element having a second inductance $L_b$. The impedance elements 4, 5 are in series connection with the amplifier's bias supply voltage Vdd, for example 2.7 V for low voltage applications. This voltage serves as a reference voltage for the switching transistor detailed below.

The second impedance element 5 is in parallel connection with the drain node 7 and source node 8 of a switching transistor 9, for example a MESFET switching transistor. The inductor in parallel with the switching transistor keeps the conducting gates at the same potential and prevents any DC voltage drop across the transistor. A current blocking biasing resistor 11 is connected at the gate 12 of the switching transistor 9.

When the switching transistor 9 is nonconducting, or switched to off, the first and second impedance elements 4, 5 are conducting. The tuning impedance of the circuit 1 is the sum of the first inductance $L_a$ and the second inductance $L_b$. The circuit 1 is tuned to a first input RF signal at a first frequency band, and the RF signal of the first frequency band is provided at the RF output port 3.

The switching transistor is biased on and off, conducting and nonconducting, by changing its bias voltage. The conducting drain and source nodes 7, 8 of the switching transistor 9 are connected to the second impedance element 5 to short the second impedance element. More specifically, the gate 12 of the switching transistor 9 is biased by a band control voltage source 13 that supplies a band control voltage $V_{dd}$ through the biasing resistor 11 at the gate 12 of the switching transistor 9, causing the switching transistor 9 to conduct and open circuit, or bypass, the second inductance impedance element 5. Accordingly, with the switching transistor 9 conducting, or switched to on by the band control voltage, the tuning impedance of the circuit 1 is due to the first impedance element 4 alone. The circuit 1 is tuned to a second input RF signal at a second frequency band, and the second RF signal is passed by the conducting switching transistor 9 and is provided at the RF output port 3.

Further, for example, the input RF signal is supplied first to an amplifier 14 at the RF input port 2. The amplifier 14 is referenced to ground at 15 in a manner to be described in conjunction with FIG. 3.

Figure 2:
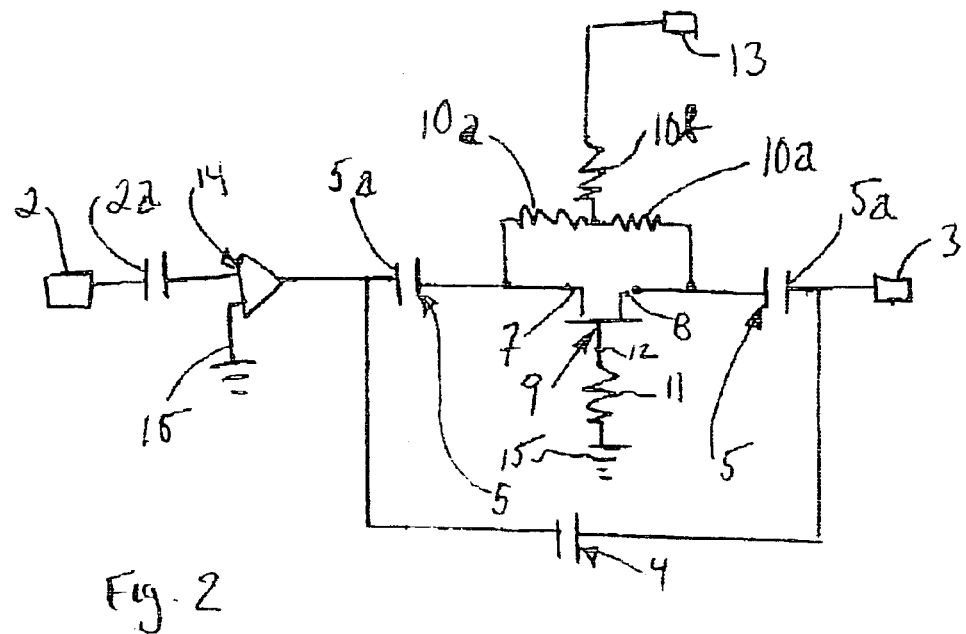
FIG. 2 is a schematic view of another embodiment of a dual band RF tuning circuit.

With reference to FIG. 2, another embodiment of the dual band RF tuning circuit 1, in the form of a dual band capacitance tuning circuit, will now be described. The circuit 1, of FIG. 2, comprises a first impedance element 4 in the form of a capacitance impedance element of capacitance $C_a$ between the input port 2 and the output port 3. A second impedance element 5, comprises series connected, two capacitance impedance elements 5a, each having capacitances $C_b$. The second capacitance impedance element 5, of FIG. 2, is in parallel connection with the first capacitance impedance element 4.

The current blocking resistance 10, of FIG. 2, provides the band control voltage to the conducting drain and source nodes 7, 8 of the switching transistor through the additional biasing resistors 10a. Each biasing resistor 10a has a resistance value of 5K Ohms, for example. The resistors 10a are of equal resistive value to maintain the conducting drain and source nodes 7, 8 at the same potential. A similar biasing resistor 11 connects at the gate of the switching transistor 9 and is referenced to ground 15.

The switching transistor 9, of FIG. 2, is connected to the second capacitative impedance element 5, to open circuit or disconnect the second capacitative impedance element 5. More specifically, the drain and source nodes 7, 8 of the switching transistor 9 are in series connection with, and between the two capacitance impedance elements 5a, of FIG. 2. When the switching transistor 9 is switched on, or conducting, the capacitance of the circuit 1 is the mathematical sum of the first capacitance $C_a$ plus ½ of the capacitance $C_b$. Accordingly, the circuit 1 is tuned to a first input RF signal at a first bandwidth, and the conducting switching transistor 9 passes the first input RF signal to the RF output port 3. The switching transistor 9 is turned off by having the drain and source nodes 7, 8 biased to the same potential by the band control voltage Vdd supplied at a low voltage value, for example 2.7 volts, at point 13. Turning off the switching transistor 9, means that the switching transistor 9 effectively disconnects or open circuits the two capacitance impedance elements 5a that comprise the second capacitance impedance 5, which switches the capacitance of the circuit 1 to the value of the first capacitance $C_a$. Accordingly, with the switching transistor turned off, or nonconducting, tuning circuit 1 is tuned solely by the first capacitative impedance element 4 alone. Thereby, the tuning circuit 1 is tuned to an input RF signal at a second bandwidth. For example, the input RF signal is amplified by the amplifier 14.

Figure 3:
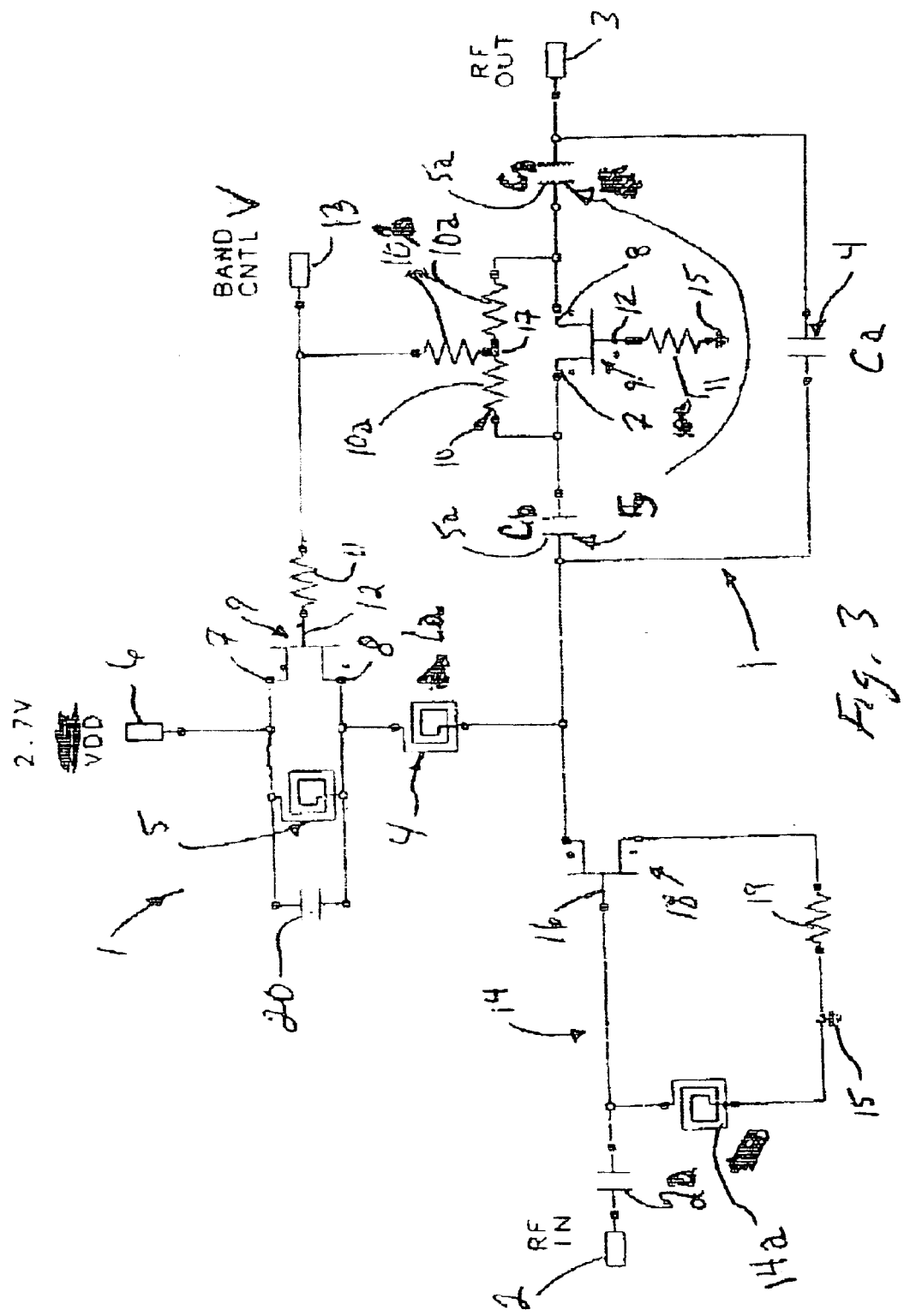
FIG. 3 is a schematic view of another embodiment of a dual band RF tuning circuit.
Figure 4:
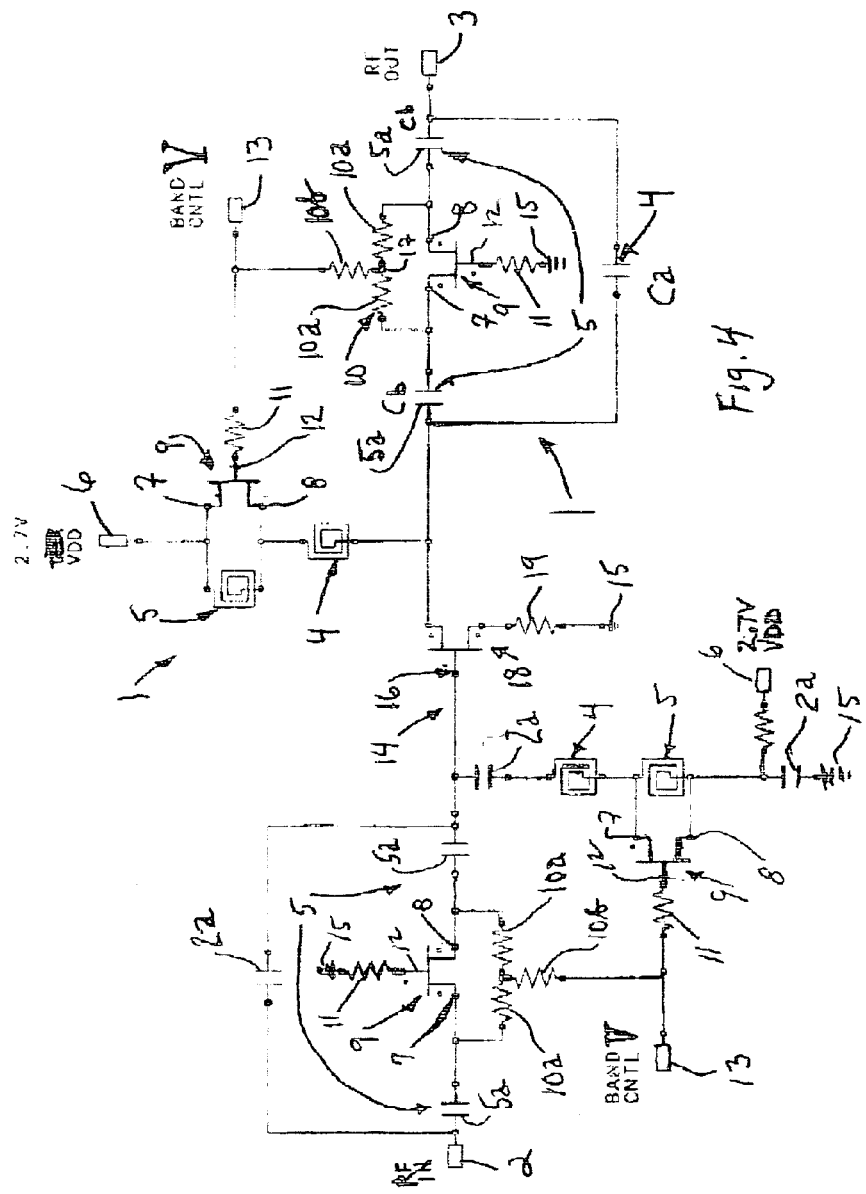
FIG. 4 is a schematic view of another embodiment of a dual band RF tuning circuit implementing switchable inductance and capacitance circuits at an input of a dual band filter.

With reference to FIGS. 3 and 4, each of two embodiments of the amplifier 14 will now be described, with like parts having like numerals. For the embodiment of FIG. 3, an input RF signal is supplied through the DC blocking capacitor 2a to the gate 16 of a MESFET transistor 18. The capacitor 2a and the inductor 14a are single impedance circuit elements, which could be made to be switchable between two frequency bands by adding the same inductance circuit and capacitance circuit as described in FIGS. 1 and 2. More specifically, with reference to FIG. 4, the capacitor 2a is an impedance element, similar to the impedance element 4 that is shown in FIG. 2, in the form of a capacitance impedance element of capacitance $C_a$ between the input port 2 and the output port 3. A second impedance element 5, comprises series connected, two capacitance impedance elements 5a, each having capacitances $C_b$. The second capacitance impedance element 5, of FIG. 4, is in parallel connection with the first capacitance impedance element 2a.

The current blocking resistance 10, of FIG. 4, provides the band control voltage to the conducting drain and source nodes 7, 8 of the switching transistor 9 through the additional biasing resistors 10a. Each biasing resistor 10a has a resistance value of 5K Ohms, for example. The resistors 10a are of equal resistive value to maintain the conducting drain and source nodes 7, 8 at the same potential. A similar biasing resistor 11 connects at the gate of the switching transistor 9 and is referenced to ground 15.

The switching transistor 9, of FIG. 4, is connected to the second capacitive impedance element 5, to open circuit or disconnect the second capacitive impedance element 5.

More specifically, the drain and source nodes 7, 8 of the switching transistor 9 are in series connection with, and between the two capacitance impedance elements 5a, of FIG. 4. When the switching transistor 9 is switched on, or conducting, the capacitance of the circuit 1 is the mathematical sum of the first capacitance $C_a$ plus ½ of the capacitance $C_b$. Accordingly, the input side of the amplifier 14 of circuit 1 is tuned to a first input RF signal at a first bandwidth, and the conducting switching transistor 9 at the input side passes the first input RF signal to the amplifier 14. The switching transistor 9 is turned off by having the drain and source nodes 7, 8 biased to the same potential by the band control voltage $V_{dd}$ supplied at a low voltage value, for example 2.7 volts, at input terminal, at point 13. Turning off the switching transistor 9, means that the switching transistor 9 effectively disconnects or open circuits the two capacitance impedance elements 5a that comprise the second capacitance impedance 5, which switches the capacitance of the input side of the amplifier 14 to the value of the first capacitance $C_a$. Accordingly, with the switching transistor turned off, or nonconducting, the input side of the tuning circuit 1 is tuned solely by the first capacitive impedance element 4 alone. Thereby, the tuning circuit 1 is tuned to an input RF signal at a second bandwidth.

Further, with reference to FIG. 4, a dual band inductance tuning circuit is connected at an input side of an amplifier 14 between an RF input port 2 and an RF output port 3. The input port 2 receives an input RF signal of a selected frequency band. The input port includes a DC blocking capacitor 2a. Tuning is provided by a first impedance element 4 in the form of an inductance impedance element having a first inductance $L_a$ and a second impedance element 5 in the form of a second inductance element having a second inductance $L_b$. The impedance elements 4, 5 are in series connection with the amplifier's bias supply voltage Vdd, for example 2.7 V for low voltage applications. This voltage serves as a reference voltage for the switching transistor detailed below. With reference to FIG. 4, the dual band inductance tuning circuit is similar to that as described with reference to FIGS. 2 and 3, with the exception that the blocking capacitors 2A are added at each end, the input end and the output end, of the dual inductance tuning circuit, to allow proper biasing of the switching transistor 9 without changing the bias of the active transistor 18. Thus, the dual band tuning circuits are provided in the input matching circuit as well as the output matching circuit. The operation of the dual band inductance circuit is similar to that described with reference to FIGS. 2 and 3, and further having DC blocking capacitors at each of the input and output matching circuits to allow proper biasing of the switching transistor 9 without changing the bias of the input and output matching circuits.

Further with reference to FIG. 4, the second impedance element 5 is in parallel connection with the drain node 7 and source node 8 of a switching transistor 9, for example a MESFET switching transistor. The inductor in parallel with the switching transistor keeps the conducting gates at the same potential and prevents any DC voltage drop across the transistor. A current blocking biasing resistor 11 is connected at the gate 12 of the switching transistor 9.

When the switching transistor 9 is nonconducting, or switched to off, the first and second impedance elements 4, 5 are conducting. The tuning impedance of the circuit 1 is the sum of the first inductance $L_a$ and the second inductance $L_b$. The circuit 1 is tuned to a first input RF signal at a first frequency band, and the RF signal of the first frequency band is provided at the input side of the amplifier 14.

The switching transistor 9 is biased on and off, conducting and nonconducting by changing its bias voltage. The conducting drain and source nodes 7, 8 of the switching transistor 9 are connected to the second impedance element 5 to short the second impedance element. More specifically, the gate 12 of the switching transistor 9 is biased by a band control voltage source 13 that supplies a band control voltage $V_{dd}$ through the biasing resistor 11 at the gate 12 of the switching transistor 9, causing the switching transistor 9 to conduct and open circuit, or bypass, the second inductance impedance element 5. Accordingly, with the switching transistor 9 conducting, or switched to on by the band control voltage, the tuning impedance of the circuit 1 is due to the first impedance element 4 alone. The circuit 1 is tuned to a second input RF signal at a second frequency band, and the second RF signal is passed by the conducting switching transistor 9 and is provided to the input side of an amplifier 14 at the input side of the circuit 1.

With further reference to each of FIGS. 3 and 4, the output of the amplifier 14 is supplied to the input side of the RF tuning circuit 1 that comprises either the inductive tuning circuit, as described and shown in FIG. 1, or the capacitive tuning circuit, as described and shown in FIG. 2. Further, the RF signal is supplied, according to another embodiment, to both of the tuning circuits 1 simultaneously, as in each of FIGS. 3 and 4, to provide even greater precise tuning by both an inductive tuning circuit and a capacitive tuning circuit. Either the inductive tuning circuit or the capacitive tuning circuit of each of FIGS. 3 and 4 can be eliminated. However, with both tuning circuits 1 operative simultaneously, it is possible to optimally compensate for all stray capacitance and/or stray inductance from external sources.

Figure 5:
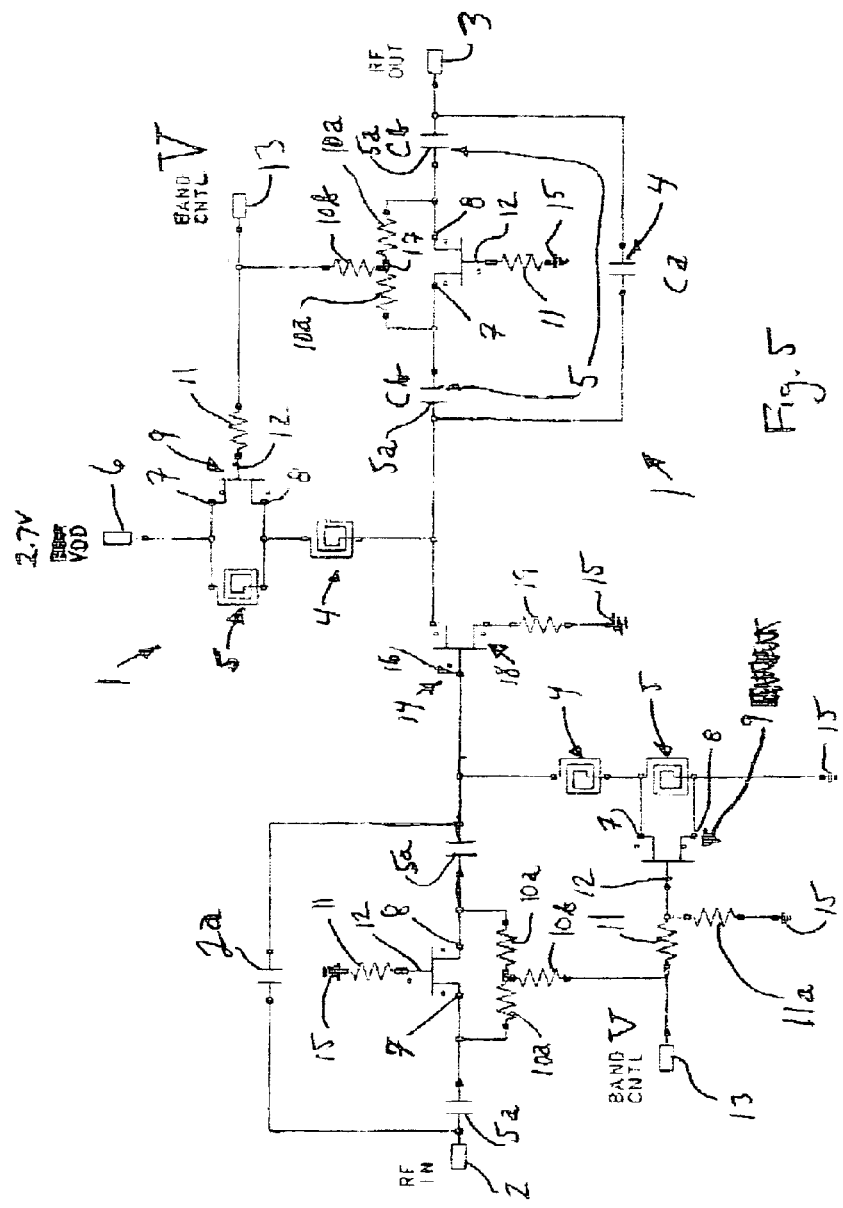
FIG. 5 is a schematic view of another embodiment of a dual band RF tuning circuit having EFET transistors and implementing switchable inductance and capacitance circuits at an input of a dual band filter.

With reference to FIG. 5, the switching transistor 9 at the input side of the circuit 1 is an EFET transistor 9 that conducts upon making use of a positive gate voltage, as compared with the MESFET transistors 9 that conduct with a negative gate voltage. The use of the EFET transistor 9 allows elimination of the blocking capacitors shown in FIG. 4. With the EFET transistor 9 as the switching transistor 9 an additional biasing resistance is needed at the gate to reduce the switch control voltage to −0.06 V, which is below the level where gate current occurs. The EFET transistor 9, FIG. 5, uses a further resistor 11a connected at the junction of the resistor 11 and the gate 12 of the EFET transistor 9 and referenced to ground at 15, which reduces the switch control voltage to a voltage level, approximately 0.6V, that is below the level where gate currents occur, and which renders the gate 12 positive. The use of the EFET transistor 9 in FIG. 5, avoids the need for the blocking capacitors 2A in FIG. 4. Each switching transistor 9 in the circuit shown in FIG. 5 that is a MESFET transistor can be replaced with an EFET transistor with the addition of a further resistor 11a referenced to ground and connected at the junction of the resistor 11 and the gate of an EFET transistor. The advantage is that each EFET switching transistor 9 conducts by using a positive gate voltage, instead of a negative gate voltage that is used by an MESFET transistor.

The switching transistor 9 of each embodiment has a negligible impedance, permitting precise tuning of each embodiment of the tuning circuit 1 to the optimal narrow band performance. The embodiments of the tuning circuit 1 respectively maintain their DC characteristics of each inductor and capacitor, which avoid adverse impact on the biasing of external active devices in RF circuits. Further, the switching transistor 9 is switched with a low voltage, adapting the embodiments of the tuning circuit 1 for low voltage operation. Further, the switching transistor 9 is digitally switched with quick response to change the RF tuning band. Further, the switching transistor 9 is integrated into each embodiment of the tuning circuit 1, as a single integrated circuit, MMIC, avoiding a requirement for an external discrete device to do the switching. Further, the switching transistor 9, as well as its biasing resistors and the other reactive circuit elements of each of the tuning circuits, are readily fabricated in small sizes when fabricated on an MMIC as a single unit. The combined ability to change inductance and capacitance, the preservation of low voltage DC switching operation, and the simplicity and small size of the invention enables fabrication of a multiple band RF switching device in a single MMIC. Further, because there is no DC Voltage across the switching transistor, the dual matching structures do not cause a significant reduction in output power or linearity performance of the amplifier circuits.

Other embodiments and modifications of the invention are intended to be covered by the spirit and scope of the appended claims.

What is claimed is:

1. A dual band RF tuning circuit comprising:
   a first impedance element and a second impedance element between an RF input port and an RF output port,
   the tuning circuit being tuned by the first and second impedance elements to receive a first RF signal and to provide the first RF signal at the output port,
   the tuning circuit being tuned by the first impedance element alone to receive a second RF signal and to provide the second RF signal at the output port,
   a switching transistor being switched on and off by changing its bias voltage,
   a band control voltage source connected to the switching transistor to change its bias voltage, and
   the switching transistor having conducting gates connected to the second impedance element to short the second impedance element, which tunes the tuning circuit by the first impedance element.

2. A dual band RF tuning circuit as recited in claim 1, wherein the first and second impedance elements are inductance impedance elements.

3. A dual band RF tuning circuit as recited in claim 1, wherein the first and second impedance elements are capacitance impedance elements.

4. A dual band RF tuning circuit as recited in claim 1, and further comprising: conducting drain and source nodes of the switching transistor being in parallel connection with the second impedance element to open circuit the second impedance element.

5. A dual band RF tuning circuit as recited in claim 4, wherein the first and second impedance elements are inductance impedance elements.

6. A dual band RF tuning circuit as recited in claim 1, and further comprising: a first resistance connected across a gate of the switching transistor, the source of band control voltage being connected to a dividing point of the first resistance, and the conducting drain and source nodes of the switching transistor being in series connection with the second impedance element to open-circuit the second impedance element.

7. A dual band RF tuning circuit as recited in claim 6, wherein the first and second impedance elements are capacitance impedance elements.

8. A dual band RF tuning circuit as recited in claim 6, wherein the first resistance is a current blocking resistance in parallel connection with the conducting drain and source nodes of the switching transistor, and the source of band control voltage is connected through a second resistor to the dividing point of the first resistance.

9. A dual band RF tuning circuit comprising:
   a first inductance impedance element and a second inductance impedance element between an RF input port and an RF output port,
   the tuning circuit being tuned by the first and second inductance impedance elements to receive a first RF signal and to provide the first RF signal at the output port,
   the tuning circuit being tuned by the first inductance impedance element alone to receive a second RF signal and to provide the second RF signal at the output port,
   a first switching transistor being switched on and off by changing its bias voltage,
   a band control voltage source connected to the first switching transistor to change its bias voltage,
   the first switching transistor having conducting drain and source nodes connected to the second inductance impedance element to short the second inductance impedance element, which tunes the tuning circuit by the first inductance impedance element,
   a first capacitance impedance element and a second capacitance impedance element between the RF input port and the RF output port,
   the tuning circuit being tuned by the first and second capacitance impedance elements to receive a first RF signal and to provide the first RF signal at the output port,
   the tuning circuit being tuned by the first capacitance impedance element alone to receive a second RF signal and to provide the second RF signal at the output port,
   a second switching transistor being switched on and off by changing its bias voltage,
   the band control voltage source connected to the second switching transistor to change its bias voltage, and
   the second switching transistor having conducting drain and source nodes connected to the second capacitance impedance element to short the second capacitance impedance element, which tunes the tuning circuit by the first capacitance impedance element.

10. A dual band RF tuning circuit as recited in claim 9, and further comprising: the conducting drain and source nodes of the first switching transistor being in parallel connection with the second inductance impedance element to short the second inductance impedance element.

11. A dual band RF tuning circuit as recited in claim 9, and further comprising: a first resistance connected to a gate of the second switching transistor, and the source of band control voltage being connected to a dividing point of the first resistance, and the conducting drain and source nodes of the second switching transistor being in series connection with the second capacitance impedance element to short the second capacitance impedance element.

12. A dual band RF tuning circuit as recited in claim 11, wherein the first resistance is a current blocking resistance in parallel connection with the conducting drain and source nodes of the second switching transistor, and the source of band control voltage is connected through a second resistor to a dividing point of the first resistance.

13. A dual band RF tuning circuit as recited in claim 9, and further comprising: the first switching transistor is an EFET transistor, and a further resistor is referenced to ground and is connected at the gate fo the EFET transistor.

14. A dual band RF tuning circuit as recited in claim 9, and further comprising: the output of the RF tuning circuit being supplied to an amplifier at an input side of a second dual band RF tuning circuit.

15. A dual band RF tuning circuit as recited in claim 9, and further comprising: the output of the switching transistor being supplied to an amplifier at an input side of the dual band RF tuning circuit, and a duplicate of the switching transistor being supplied to an output port of the dual band RF tuning circuit, whereby, the input side and the output side are tuned to dual band frequencies.

16. The dual band RF tuning circuit as recited in claim 1, wherein the switching transistor is a MESFET.

17. The dual band RF tuning circuit as recited in claim 16, wherein said switching transistor is integrally formed with the tuning circuit in a single integrated circuit.

18. The dual band RF tuning circuit as recited in claim 1, wherein said switching transistor is integrally formed with the tuning circuit in a single integrated circuit.

19. The dual band RF tuning circuit as recited in claim 9, wherein the first switching transistor is a MESFET.

20. The dual band RF tuning circuit as recited in claim 9, wherein the second switching transistor is integrally formed with the tuning circuit in a single integrated circuit.

21. A dual band RF tuning circuit comprising:

a first dual band RF tuning circuit as recited in claim 9;

an amplifier coupled to receive an output of the first dual band RF tuning circuit; and a second dual band RF tuning circuit as recited in claim 9 coupled to receive an output of the amplifier.

\* \* \* \* \*